(12) United States Patent
Fontecchio et al.

(10) Patent No.: US 10,675,772 B2
(45) Date of Patent: *Jun. 9, 2020

(54) PRINTED LUBRICIOUS MATERIAL DISPOSED ON RAZOR BLADES

(71) Applicant: The Gillette Company, Boston, MA (US)

(72) Inventors: Marco Fontecchio, Framingham, MA (US); John Chadwick, Pelham, NH (US); Andrew Charles Nicholas, Winchester, MA (US); Jeffrey Richard Holley, Scituate, MA (US)

(73) Assignee: The Gillette Company LLC, Boston, MA (US)

( * ) Notice: Subject to any disclaimer, the term of this patent is extended or adjusted under 35 U.S.C. 154(b) by 239 days.

This patent is subject to a terminal disclaimer.

(21) Appl. No.: 15/197,475

(22) Filed: Jun. 29, 2016

(65) Prior Publication Data

US 2018/0001497 A1   Jan. 4, 2018

(51) Int. Cl.
| | |
|---|---|
| *B26B 21/60* | (2006.01) |
| *B26B 21/40* | (2006.01) |
| *B26B 21/44* | (2006.01) |
| *B41J 2/01* | (2006.01) |
| *C23C 14/24* | (2006.01) |

(52) U.S. Cl.
CPC .......... *B26B 21/60* (2013.01); *B26B 21/4068* (2013.01); *B26B 21/443* (2013.01); *B41J 2/01* (2013.01); *C23C 14/24* (2013.01)

(58) Field of Classification Search
None
See application file for complete search history.

(56) References Cited

U.S. PATENT DOCUMENTS

| | | | | |
|---|---|---|---|---|
| 4,012,551 | A | * | 3/1977 | Bogaty .................... B05D 7/16 30/346.53 |
| 4,208,471 | A | * | 6/1980 | Bresak ................. C09D 183/04 428/447 |
| 4,211,006 | A | | 7/1980 | Halaby et al. |
| 4,301,588 | A | * | 11/1981 | Horng ................. H01L 21/2257 257/E21.151 |
| 5,630,275 | A | | 5/1997 | Wexler |
| 5,818,604 | A | | 10/1998 | Delabastita et al. |
| 5,915,791 | A | | 6/1999 | Yin et al. |

(Continued)

*Primary Examiner* — Cachet I Proctor
(74) *Attorney, Agent, or Firm* — Joanne N. Pappas; Kevin C. Johnson

(57) ABSTRACT

A razor blade having an improved lubricious material deposited thereon and a method of making a razor blade for a razor cartridge having such a material disposed thereon are described herein. A novel printing process and printing material are provided where at least one printing material is deposited on one or more razor blades via a printing process which includes one or more print heads for printing the at least one printing material and forming at least one printed object on a tip or one or more sides of the razor blade. The printing material may comprise about of about 0.25% solid to about 50% solids by weight of composition of telomer and further desirably comprises glycerol and/or an antifoam material. Optimizing coverage of the printing material may be achieved by changing materials, print heads, the firing frequency of the print head or angling or rotating the print heads.

26 Claims, 13 Drawing Sheets

(56) References Cited

U.S. PATENT DOCUMENTS

| | | | |
|---|---|---|---|
| 6,161,287 A | 12/2000 | Swanson et al. | |
| 6,228,428 B1* | 5/2001 | Trankiem | B26B 21/60 |
| | | | 427/284 |
| 6,923,115 B1 | 8/2005 | Litscher et al. | |
| 7,103,977 B2* | 9/2006 | Guimont | B26B 21/44 |
| | | | 30/41 |
| 7,126,724 B2 | 10/2006 | McCrea et al. | |
| 8,104,887 B2 | 1/2012 | Albrecht et al. | |
| 8,418,608 B2 | 4/2013 | Preckel | |
| 9,314,953 B2 | 4/2016 | Lauer et al. | |
| 2002/0000041 A1 | 1/2002 | Doroodian-Shoja | |
| 2004/0181943 A1 | 9/2004 | Kwiecien | |
| 2005/0094212 A1 | 5/2005 | Asai et al. | |
| 2005/0246898 A1 | 11/2005 | Gilder | |
| 2007/0062047 A1* | 3/2007 | Zhuk | B26B 21/22 |
| | | | 30/346.53 |
| 2008/0034590 A1 | 2/2008 | Prudden et al. | |
| 2009/0223057 A1 | 9/2009 | Coope-Epstein et al. | |
| 2010/0096386 A1 | 4/2010 | Uptergrove et al. | |
| 2010/0225940 A1 | 9/2010 | Gargir et al. | |
| 2011/0126413 A1 | 6/2011 | Szczepanowski et al. | |
| 2012/0000047 A1 | 1/2012 | Jones | |
| 2012/0000074 A1 | 1/2012 | PazosSchroeder | |
| 2013/0180117 A1* | 7/2013 | Hobson, Sr. | B26B 21/4068 |
| | | | 30/346.53 |
| 2014/0310960 A1 | 10/2014 | Ariyanayagam et al. | |
| 2014/0323374 A1 | 10/2014 | Stephens et al. | |
| 2016/0136967 A1 | 5/2016 | Allen et al. | |
| 2016/0136969 A1 | 5/2016 | Allen et al. | |
| 2016/0199990 A1 | 7/2016 | Nicholas et al. | |
| 2016/0199991 A1 | 7/2016 | Nicholas | |
| 2016/0199992 A1 | 7/2016 | Nicholas et al. | |
| 2016/0207211 A1 | 7/2016 | Madeira et al. | |

\* cited by examiner

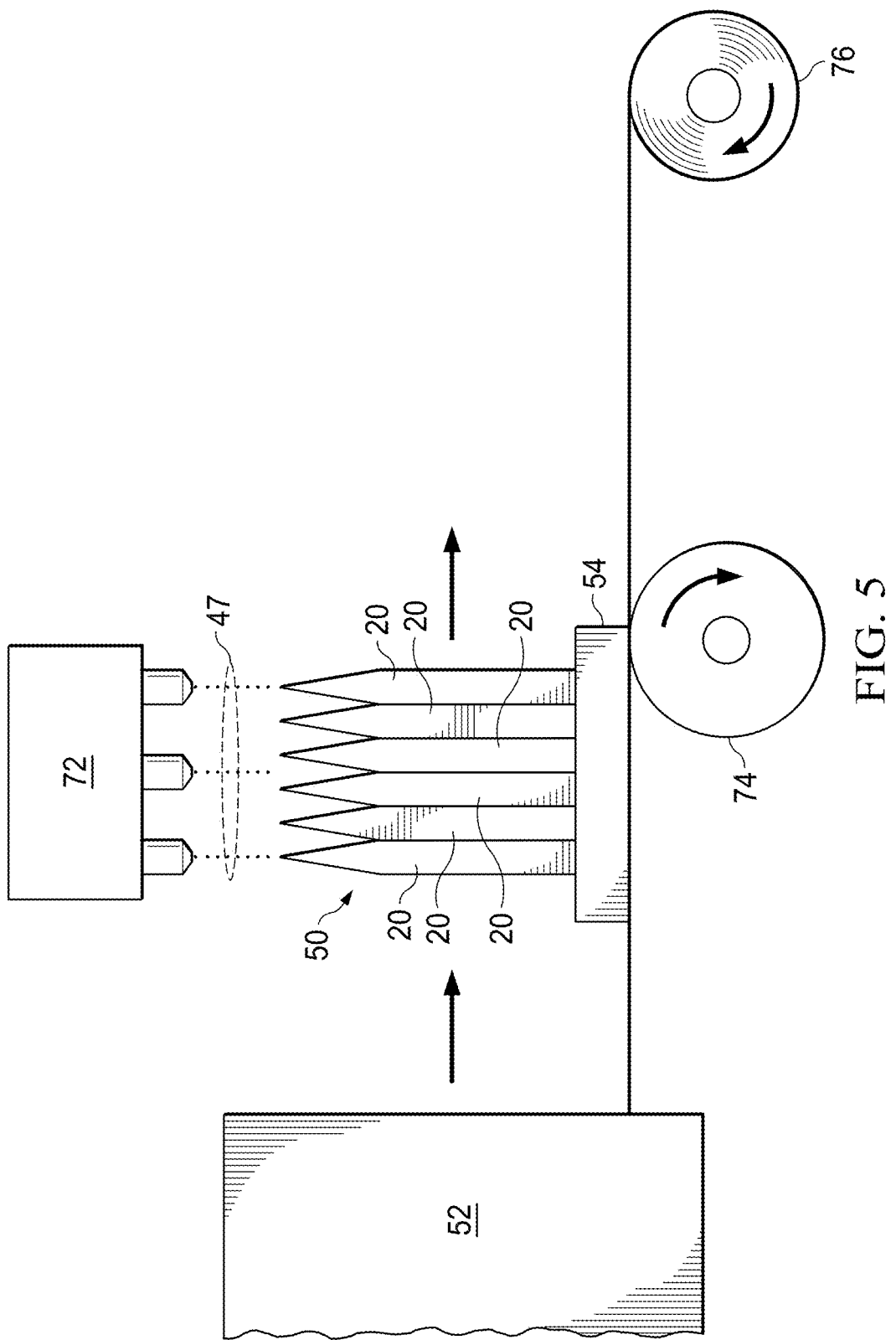

PRINTED LUBRICIOUS MATERIAL DISPOSED ON RAZOR BLADES

FIELD OF THE INVENTION

The invention relates to razors, razor blades, and more particularly to razor cartridges having razor blades with at least one printing material comprised of printed objects or printed portions.

BACKGROUND OF THE INVENTION

Users of wet shaving razors are susceptible to excessive nicking and cutting. There are many possible explanations for this, but one of them is how the razor blade moves or glides over the skin. Moreover, as the number of razor blades per cartridge increases, the total blade drag on skin against the skin can also increase.

Most razor blades on the market are produced by applying one or more coatings such as thin film hard coatings to sharpened stainless steel substrates. These coatings may typically deposited on blade edges by Physical Vapor Deposition (PVD) techniques which include vacuum conditions where raw materials, referred to as target materials, i.e., the material that is going to be deposited, are generally in solid form. Common PVD techniques incorporate processes such as sputter coating or Pulsed Laser Deposition (PLD).

Blade coatings were developed to minimize the irritation produced by excessive pulling of hairs which generally may continue for a considerable period of time after the pulling has ceased.

Thin hard coatings have certain roles and advantages. One advantage is that the hard coatings generally strengthen blade edges, particularly those with slim profiles, by providing reinforcement to the edges, thus protecting the edges from excessive damage during shaving.

In addition, since conventional razor blades used for wet shaving generally have increasing cutting forces with use, due to the outer coating wear and adhesion loss, most commercial razor blades also include one or more subsequent depositions of outer coatings (e.g., TEFLON® or telomer coatings, or other polymeric material coatings.

A thin polymer coating on the blade edge is generally lubricious with an inherent hydrophobic nature which causes a film of water droplets of a microscopic scale to remain on the cutting blade edge. This in turn enhances the effect of the polymer coating, and can reduce the frictional resistance between the blade edge and the skin and thereby reduce the cutting force of the hair, greatly improving shaving comfort. Such coatings are described, for example, in U.S. Pat. Nos. 5,645,894 and 5,263,256, the entire disclosures of which are incorporated by reference herein.

In general, this polymer coating is applied only to the tip of the razor blade (e.g., the last 25-50 µm) as it is generally sprayed onto blades edges which are generally arranged in a stack of blades. In some instances, over-spraying and inconsistency of the sprayed polymer are known consequences.

Accordingly, a significant portion of the razor blade is not covered with the lubricious coating but instead maintains some contact with the skin. This may be a disadvantage generally as frictional resistance may remain in uncoated areas, resulting in more tug and pull of a user's skin.

It is an object of the invention to provide a razor blade with improved skin protection, (e.g., comfort and safety) by improving the way the blade or blades in a cartridge glides or moves over the skin, thus minimizing the number of nicks and cuts experienced by a user, while also maintaining or improving rinsability of the razor cartridge.

It is an object of the invention to provide an improved lubricious coating on a razor blade and an improved method of producing such a razor blade.

SUMMARY OF THE INVENTION

The invention can improve shaving comfort and safety by improving the way the blade and cartridge glides over the skin, thus minimizing number of nicks and cuts experienced by a user. The present invention for a method of making a razor blade for a razor cartridge, includes the steps of providing a razor blade, the razor blade having a first side, an opposing second side, and a cutting edge extending along a length of said razor blade, providing at least one printing material and printing the at least one printing material to form at least one printed object on a tip or one or more sides of said razor blade. The printing process includes a print head with nozzles. The printing material of the present invention comprises telomer solids from about 0.25% solids to about 50% solids by weight of composition. The printing material of the present invention has a viscosity in the range of about 2 centipoise to about 25 centipoise. The printing material of the present invention preferably further comprises a viscosity modifier material, such as glycerol. More preferably, the printing material also comprises an antifoam material.

In a main aspect of the present invention, a method of making a razor blade for a razor cartridge is provided including the steps of providing at least one razor blade, the razor blade having a tip, a first side, an opposing second side, and a cutting edge extending along a length of the razor blade, providing at least one printing material, and printing the at least one printing material onto at least the tip of the at least one razor blade to form at least one printed object comprised of the at least one printing material. The printing step comprises inkjet printing. The inkjet printing includes at least one printhead. The inkjet printing includes first and second printheads of different types. At least one of the at least one printheads is angled at an angle from about zero (0) degrees to about ninety (90) degrees.

In one aspect, the at least one printed object has a droplet size ranging from about 40 droplets per inch to about 10,000 droplets per inch.

In another aspect, a diameter of a droplet of printing material ranges from about 10 microns or less to about 200 microns, or more and a volume of a droplet of printing material ranges from about 10 pico liters to about 100 pico liters.

In yet another aspect, the at least one printing material is lubricious and may include a polymer. The at least one printing material of the present invention comprises a telomer from about 0.25% solids to about 50% solids by weight of composition. In a further aspect, the at least one printing material comprises a viscosity modifying material. A viscosity of the printing material is from about 2 centipoise to about 25 centipoise. In yet another aspect, the at least one printing material comprises an anti-foaming material. The at least one printing material comprises less than about 10% by weight of composition of the anti-foaming material.

In another embodiment, the method further includes providing a plurality of printing materials, each one of the plurality of printing materials comprised of the same composition or different compositions.

In another embodiment, the method further includes a step (d) of sintering at least one printed object. In one aspect, the printed object melts and flows down the first side, the second side of the cutting edge of the at least one razor blade, or any combination thereof.

In another aspect of the present invention, the printing step (c) is repeated one or more times.

In another embodiment, the method further includes a step (e) of applying a second material on the at least one printed object. The second material may be different than the at least one printing material.

The present invention contemplates a plurality of razor blades on a spindle.

The method may include at least one razor blade is heated prior to printing step (c).

The at least one printed object of the present invention has a thickness of about one micrometer as measured in a direction perpendicular to one of the sides of the razor blade.

The at least one printed object comprises a plurality of solid objects of one or more printed dots. Printing step (c) can be repeated until a layer of a plurality of printed dots is formed. The at least one printed object is adjacent to the cutting edge. The at least one printed object extends along the length of the razor blade.

A razor blade for a razor cartridge of the present invention comprises a first side, an opposing second side, and a cutting edge extending along a length of the razor blade, and at least one printed object comprised of at least one printing material ink-jet printed on the cutting edge of the razor blade. The at least one printed object extends along the length of the razor blade. The at least one printing material is comprised of about 0.25% solid to about 50% solids by weight of composition of telomer.

A razor cartridge of the present invention comprises a plurality of blades each with a cutting edge, with at least one blade of the plurality of blades having at least one printed object printed thereon, the at least one printed object comprised of at least one printing material. The at least one printing material is comprised of telomer from about 0.25% solids to about 50% solids by weight of composition. One of the plurality of razor blades has a different printing material than another razor blade in the cartridge.

A printing material of the present invention comprises about 0.25% solids to about 50% solids by weight of composition of telomer, the material printed on a cutting edge of a razor blade. The printing material further comprises about 55% glycerol solution by weight of composition and/or an anti-foaming material. Droplets of the printing material have a diameter ranging from about 10 microns or less to about 200 microns, or more and a volume of a droplet ranging from about 10 pico liters to about 100 pico liters.

BRIEF DESCRIPTION OF THE DRAWINGS

While the specification concludes with claims particularly pointing out and distinctly claiming the subject matter which is regarded as forming the present invention, it is believed that the invention will be better understood from the following description which is taken in conjunction with the accompanying drawings in which like designations are used to designate substantially identical elements, and in which:

FIG. 5 is a side view of a printing process of the present invention.

DETAILED DESCRIPTION OF THE INVENTION

Figure 1:
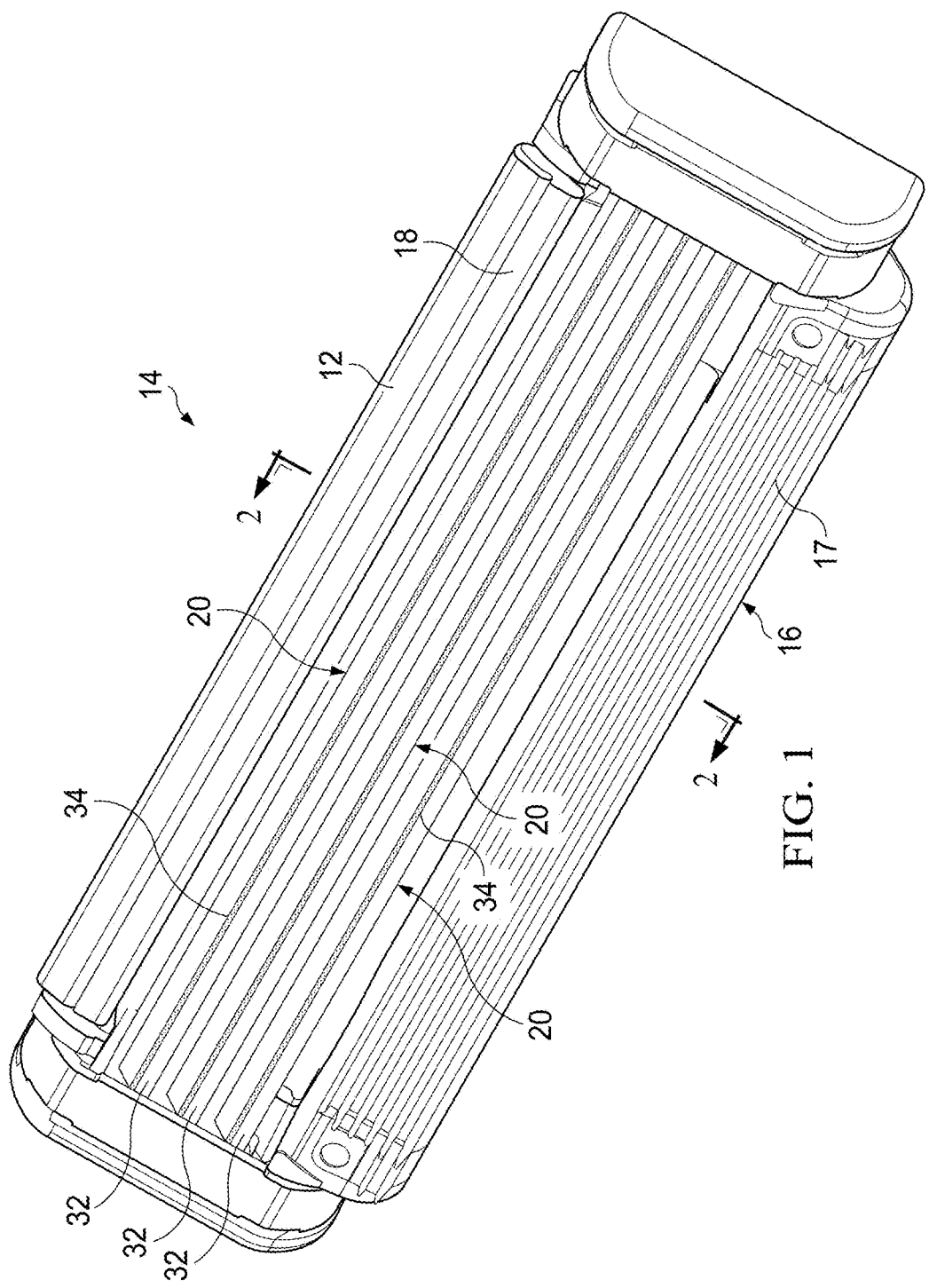
FIG. 1 is a perspective view of a razor cartridge of the present invention.

The present invention for a razor blade having an improved lubricious material deposited thereon and a method of making a razor blade for a razor cartridge having such a material disposed thereon are described herein.

As used herein, a "razor blade" signifies a sharpened steel substrate having a first side, an opposing second side, and a cutting edge extending along a length. The razor blade of the present invention may be uncoated or may be coated with one or more materials (e.g., coatings to provide hardness).

A novel printing material is deposited on one or more razor blades via a printing process which includes one or more print heads for printing the printing material and forming at least one printed object on a tip or one or more sides of the razor blade. Preferably the printing material coats both sides of the blade.

The printing material of the present invention comprises telomer from about 0.25% solids to about 50% solids by weight of composition. The printing material of the present invention has a viscosity in the range of about 2 centipoise to about 25 centipoise. The printing material of the present invention preferably further comprises a viscosity modifying material, such as glycerol. More preferably, the printing material also comprises an antifoam material. In a preferred embodiment of the present invention, up to about 55% by weight of composition of glycerol in a dispersion with telomer is provided. In such an embodiment, about 45% telomer solution by weight of composition may be provided.

Referring to FIGS. 1-3C, the razor cartridge 14 includes a guard 16 positioned at a front portion of the cartridge 14, a cap 18 positioned at a back portion of cartridge 14, and blades 20 positioned between guard 16 and cap 18. Cartridge 14 includes a top surface 22 and an opposing bottom surface 24. A lubricating member 12 is positioned on the top surface 22 of the cartridge 14. Blades 20 have a first side 30a which has a visible top surface 32a. Blades 20 also have a second side 30b with a surface 32b. Surface 32b is generally not visible.

The guard 16 may include one or more elongated flexible protrusions 17 to engage a user's skin. The flexible protrusions 17 include flexible fins generally parallel to the one or more elongated blades 20. In another embodiment, the flexible fins have at least one portion which is not generally parallel to the one or more elongated edges. Non-limiting examples of suitable guards include those used in current razor blades and include those disclosed in U.S. Pat. Nos. 7,607,230 and 7,024,776; (disclosing elastomeric/flexible fin bars); 2008/0034590 (disclosing curved guard fins); 2009/0049695A1 (disclosing an elastomeric guard having guard forming at least one passage extending between an upper surface and a lower surface). The upper surfaces of lubricating member 12 along with those of the guard 16, cap 18 and blades 20 form the skin engaging portion of the cartridge 14.

Figure 2:
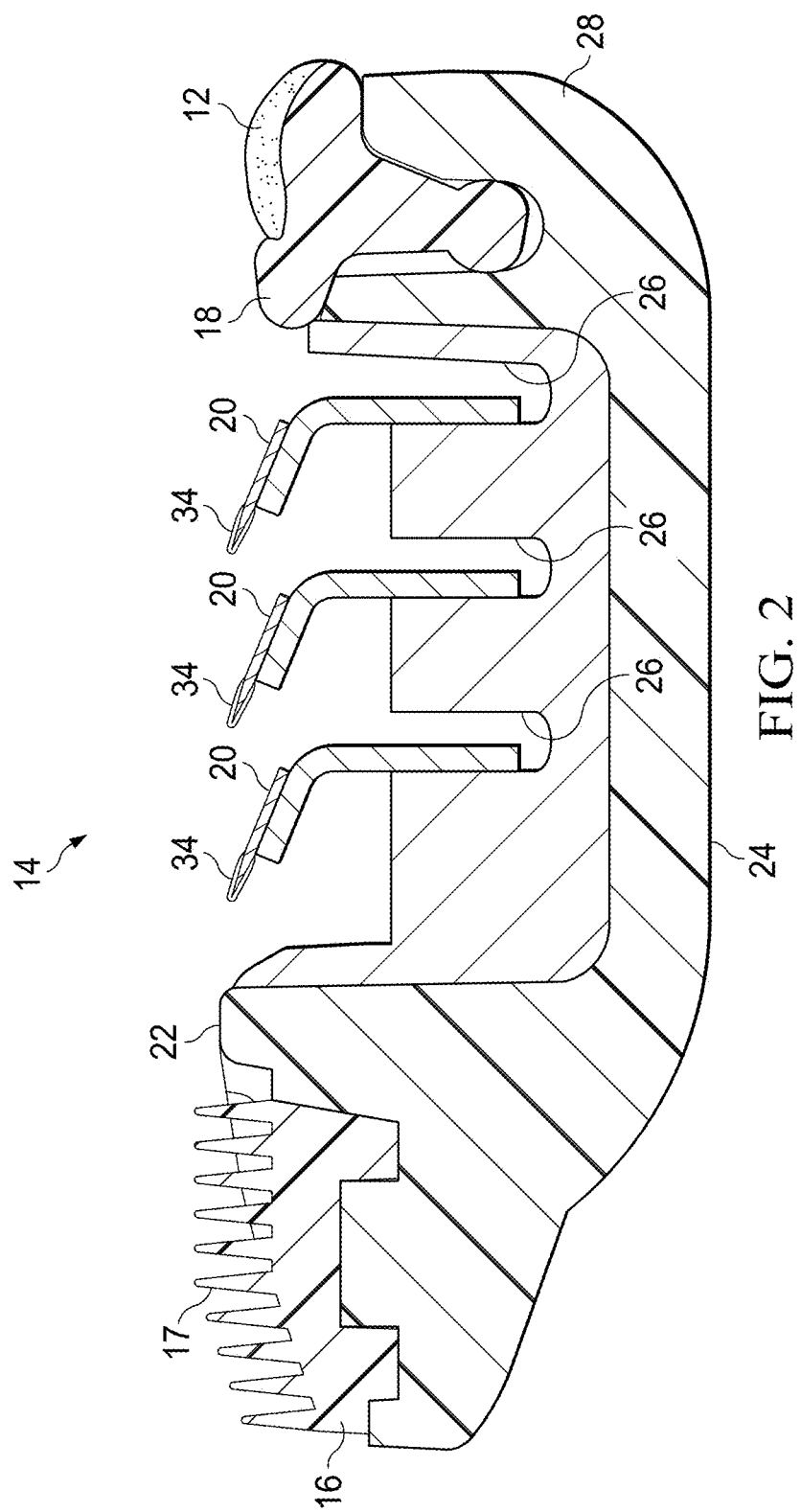
FIG. 2 is a sectional view taken along line 2-2 of FIG. 1.

The razor blades are preferably mounted in slots or openings 26 in a housing or frame 28 of the cartridge 14 as shown in FIG. 2, though any other feasible means of attachment of the blades are contemplated herein.

Figure 3A:
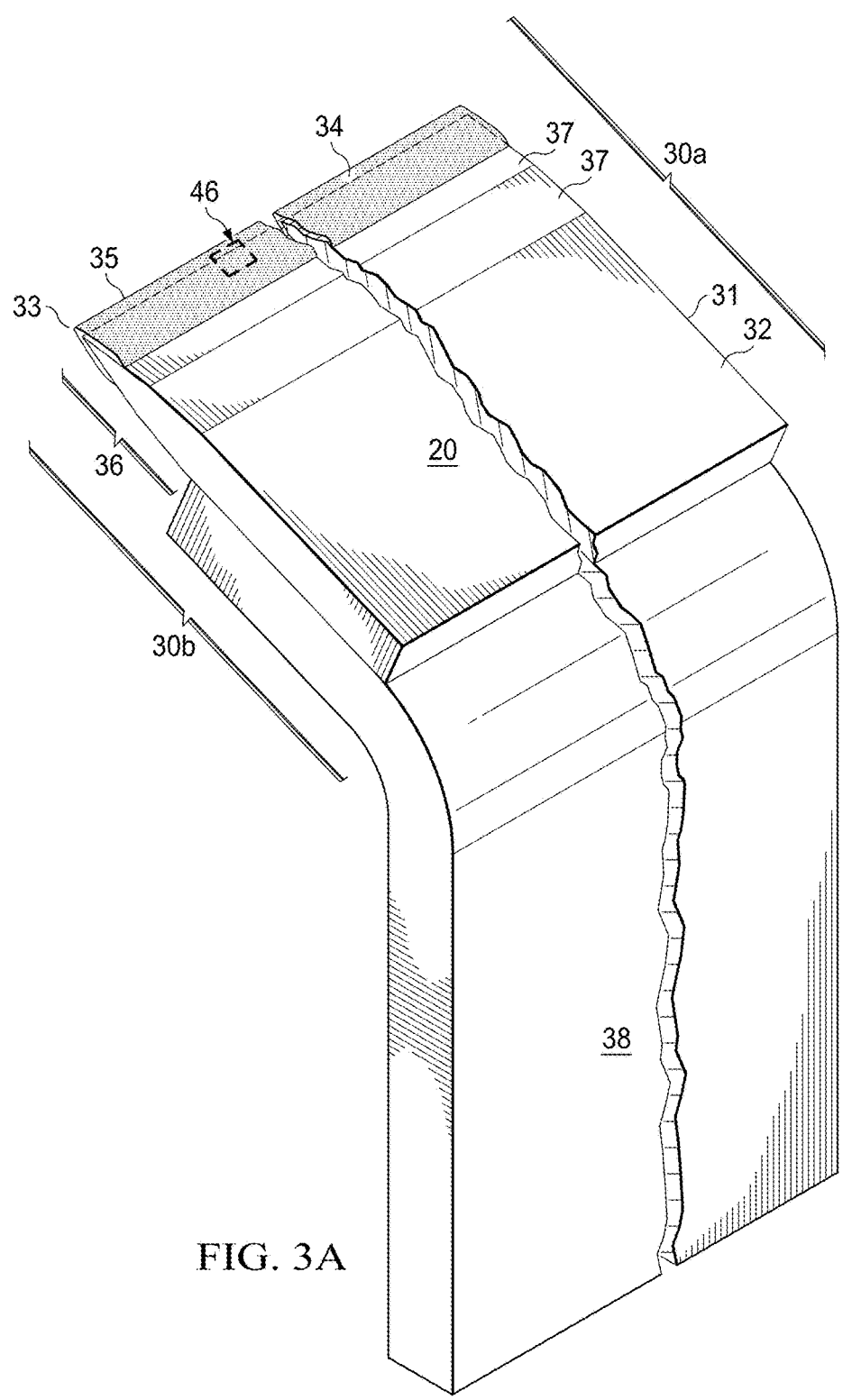
FIG. 3A is a side elevation view of a blade supported razor blade of the present invention.
Figure 3B:
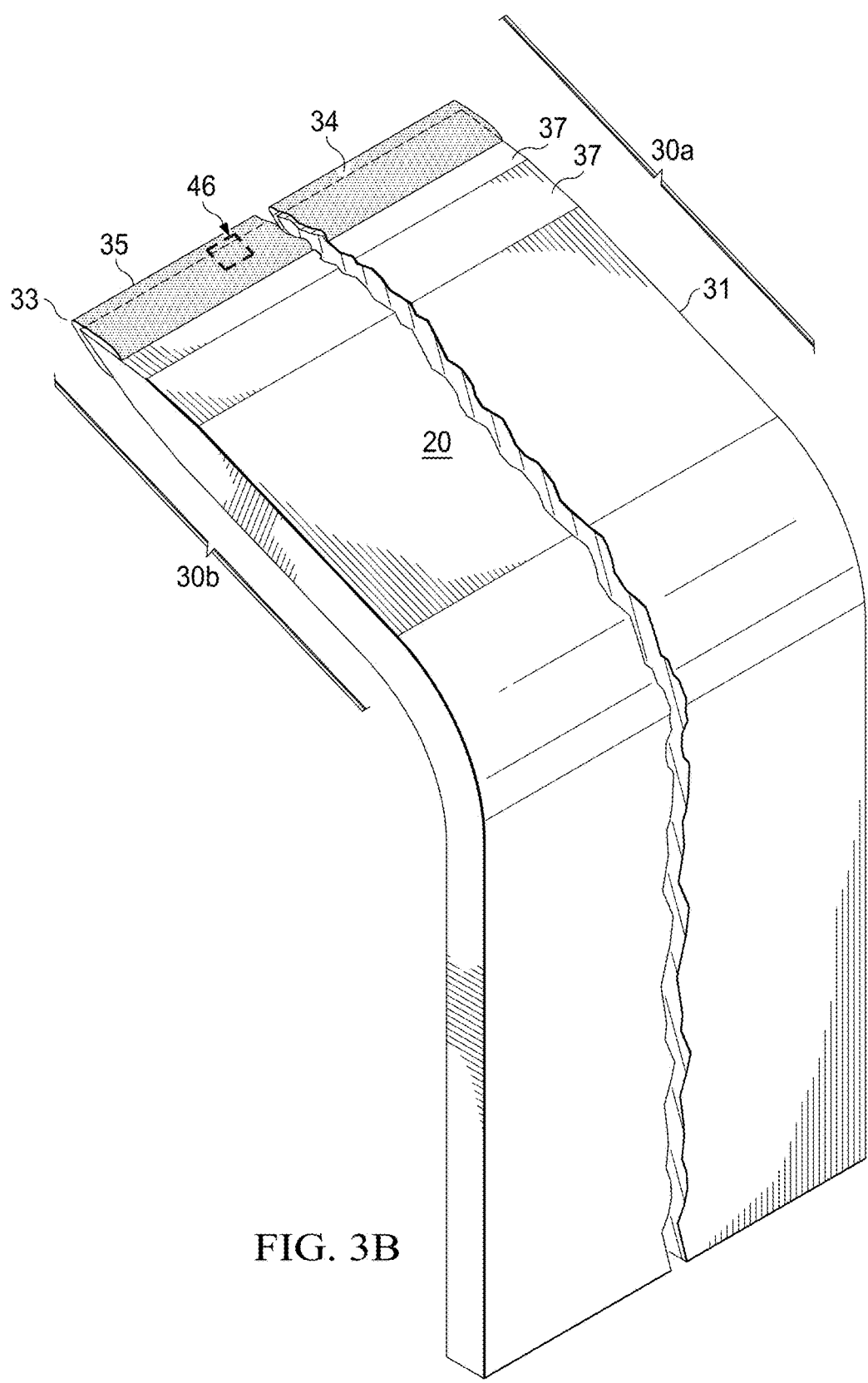
FIG. 3B is a side elevation view of a bent razor blade of the present invention.

The term "razor blade" in the present invention may desirably signify a substrate or a coated substrate. A substrate is generally comprised of stainless steel which includes a blade body and at least one flank. Desirably, a razor blade includes two flanks forming a blade edge and a blade body. The two flanks intersect at a point or tip, or what is oftentimes referred to as the ultimate tip. Each flank may have one, two, or more bevels. The blade body is generally the remaining area of the razor blade beneath the flanks or bevels. As shown in FIG. 3A, a perspective view of a blade 20 includes blade body 31, two bevels 37 for each of two flanks 36 which intersect at tip 33 forming an edge 35. As shown in FIG. 3A, the blade 20 has a first side 30a and a second opposing side 30b, the latter side connected to blade support 38. The blade 20 of the present invention may be of the bent blade type shown in FIG. 3B where the second opposing side 30b of the blade 20 is not connected to a blade support as the blade and support are generally integrated.

A "substrate" signifies one of the substances or materials which may be acted upon by the printing process resulting in a printed structure in the present invention. It is contemplated that the substrate of the present invention may also be comprised of other metals, plastic, paper, glass or any other substance. Illustrative embodiments herein generally relate to a stainless steel substrate as it is most commonly used for razor blade formation.

Most razor blades on the market are produced by applying one or more coatings such as thin film hard coatings to sharpened stainless steel substrates. These coatings may typically be deposited on blade edges by Physical Vapor Deposition (PVD) techniques which include vacuum conditions where raw materials, referred to as target materials, i.e., the material that is going to be deposited, are generally in solid form. Common PVD techniques incorporate processes such as sputter coating or Pulsed Laser Deposition (PLD).

Blade coatings were developed to minimize the irritation produced by excessive pulling of hairs which generally may continue for a considerable period of time after the pulling has ceased.

Thin hard coatings have certain roles and advantages. One advantage is that the hard coatings generally strengthen blade edges, particularly those with slim profiles, by providing reinforcement to the edges, thus protecting the edges from excessive damage during shaving.

In addition, since conventional razor blades generally have increasing cutting forces with use due to the outer coating wear and adhesion loss, most commercial razor blades include one or more subsequent depositions of coatings (e.g., TEFLON® or telomer coatings or other polymeric material coatings.

Thus, in addition to being deposited directly on a substrate of a razor blade, the printing process and resultant printed structure of the present invention may also be deposited directly on a coating or coatings (e.g., vacuum deposited coatings or outer polymeric coatings) which are already disposed on the substrate of the razor blades.

Figure 3C:
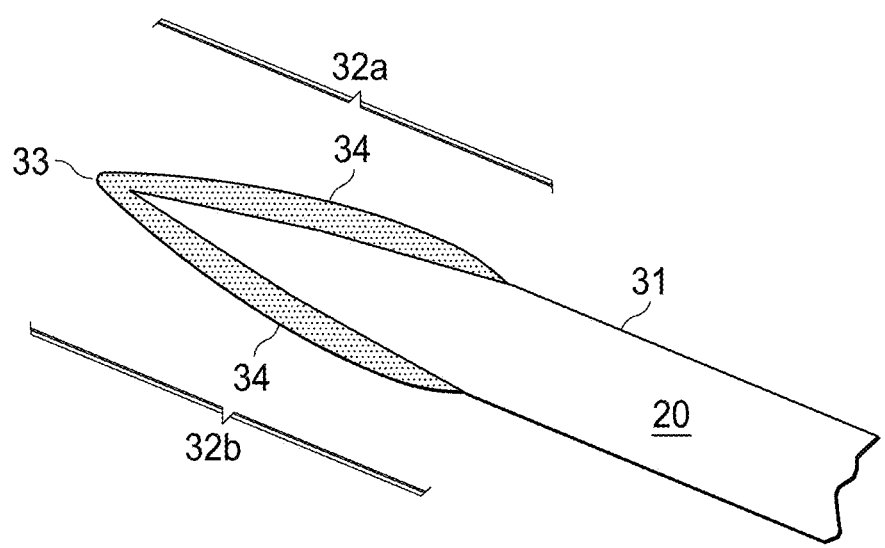
FIG. 3C is a cross-sectional view of blades of FIG. 3A or 3B.

In the present invention, first and second sides, 30a and 30b respectively, of razor blade 20 includes a printed object 34. The printed object 34 shown in FIGS. 1-3C is an object covering a portion or substantially all of tip 33 of the razor blade 20. The printed object 34 may also cover a portion or the entire surface of either or both surfaces 32a and 32b of the first side 30a and of the second side 30b, respectively, of the razor blade. As shown in FIG. 3C, for optimal skin support benefits, such as glide, both surfaces 32a and 32b of the blade include a printed object 34. Visible surfaces are generally those shown in FIGS. 3A, 3B, and 3C on the first side 30a.

It should be noted that all the printed objects of FIG. 3 are shown disposed on a tip or adjacent the tip on the cutting edge or on both a first side and a second side of the razor blade.

Figure 4:
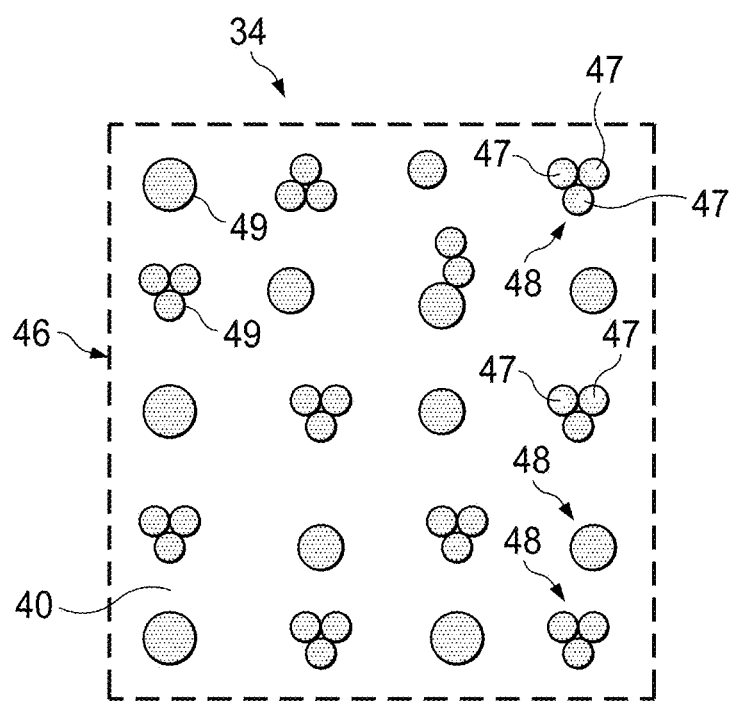
FIG. 4 is an enlarged view of a portion of the razor blade of the present invention.

Referring now to FIG. 4, solid object 46 comprises a plurality of individual printed dots 48 as they would be seen by the eye under a microscope. The individual printed dots 48 are spaced apart from one another such that free portions 40 of razor blade 20 within the solid object 46 contain no printed dots 48. That is, adjacent individual printed dots 48 are spaced apart from one another such that adjacent individual printed dots 48 do not touch one another. When adjacent individual printed dots 48 are spaced apart from one another, the periphery 49 of adjacent individual printed dots 48 do not overlap or touch one other creating free portions 40 of razor blade 20. Free portions 40 contain no printed dots 48 leaving free portions 40 exposed to the external environment. Each printed dot 48 may be comprised of a single printed droplet 47 or may be comprised of two or more, i.e., several, many, numerous, printed droplets 47 which together form a single individual printed dot 48.

A printed dot 48 made of a single printed droplet 47 will generally wear away faster compared to a printed dot 48 made of multiple printed droplets 47 having the same dimensions as the single printed droplet.

It is contemplated that a looser dot arrangement, for instance, an arrangement with smaller printed dots 48 and larger free portions 40 around them as shown in FIG. 4 may provide more flexibility of the printed object. However, this arrangement may also wear faster which, depending on the intended application, may or may not be advantageous. For instance, it may be advantageous and adequate if such a dot arrangement were printed on a blade or blades of a disposable type razor which is thrown out after one or two shaves.

On the contrary, if the solid objects were constructed of substantially solid printing coverage with little or no free portions, the printed object would wear slowly eventually exposing the underlying coatings or substrate of the razor blade. With the absence, or near-absence of free portions, the benefits provided by the printed object may generally be maintained for longer, such as those of improved glide and skin management while also minimized the wear rate of the printed object. In addition, more and larger printed dots with less spacing or free portions 40 between printed dots 48 generally results in longer lasting printed objects for the user during the shave.

The printed object will, with over time and with repeated use, wear away to expose the underlying coatings or substrate of the razor blade.

Thus, it is understood that the size, number, spacing of printed dots 48 and also the number or layers of solid objects 46 which make up the printed object 34 all play a role in the shave allowing for better glide and affecting wear rate of the printed object.

The size of the printed dots 48 may be consistent throughout the solid object 46. The size of the printed dots 48 may vary throughout the solid object. The spacing between printed dots 48 may be consistent throughout the solid object 46. The spacing between printed dots 48 may vary throughout the solid object 46. For example, it may be desirable to have the size of the printed dots 48 larger and the spacing between printed dots 48 smaller at least near the periphery of the solid object so as to increase glide, skin support, and minimize wear at least near the periphery. Or it may be desirable to have the size of the printed dots 48 smaller and the spacing between printed dots 48 larger near the center of the solid object so as increase the flexibility of the printed object and if desired, increase the wear rate.

The size of the printed droplets 47 may be consistent throughout the solid object 46. The size of the printed droplets 47 may vary throughout the solid object.

Figure 4A:
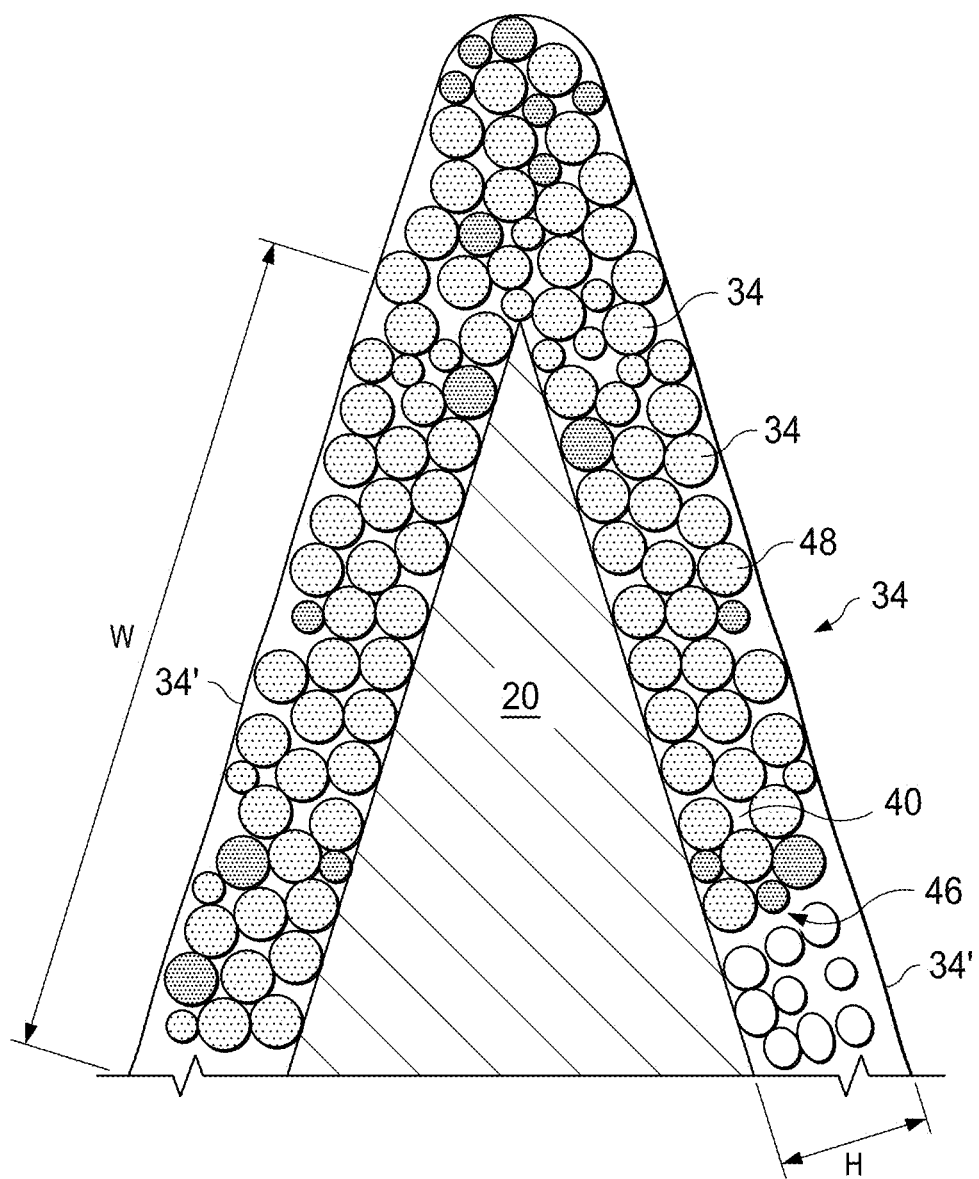
FIG. 4A is a cross-sectional side view of a printed object of the present invention.

Referring now to FIG. 4A, a printed object coating 34 formed of multiple solid objects 46 is shown on a razor blade substrate 20 having a wedge shape. The solid objects may be disposed adjacent each other or the printed dots may be applied to form a film, preferably a thin film printed object. The printed object coating 34 in FIG. 4A forms a near rectangular cross-section, with a smooth, wavy, slightly curved outer surface 34' which generally conforms to the substrate 20, though any feasible geometry is contemplated in the present invention. As can be seen, FIG. 4A depicts larger solid objects 46 which make up the one or more printed objects 34 with smaller free portion areas 40. Such an arrangement generally provides improved glide and skin management while also potentially minimizing the wear rate of the printed object.

The printed dots may be applied with any suitable type of device including, but not limited to print heads, nozzles, and other types of material deposition devices. Any suitable type of print heads can be used including, but not limited to, inkjet print heads. In certain embodiments, the deposition device is an ink jet print head. The print heads may be of a non-contacting, digital type of deposition device. By "non-contacting", it is meant that the print heads do not contact the surface to be printed. By "digital", it is meant that the print heads can apply droplets of ink only where needed such as to form a pattern in the form of words, figures (e.g., pictures), or designs.

Ink jet print heads will typically comprise one or more nozzles. The nozzles are typically generally aligned in rows and are configured to jet ink in a particular direction that is generally parallel to that of the other nozzles. The nozzles within each row on a print head can be aligned linearly. Alternatively, the nozzles may be in one or more rows that are oriented diagonally relative to the longer dimension (or length) of the print head. Both such arrangements of nozzles can be considered to be substantially linearly arrayed. The inkjet print heads can comprise any suitable number and arrangement of nozzles therein. Though any feasible print head is contemplated, one suitable print head of the present invention is an S-class industrial print head.

The print heads print droplets of a printing material. In the present invention the printing material may be comprised of a lubricious material. Desirably the printing material is further comprised of a polymeric material, and more preferably a telomer-based composition.

The droplets of printing material can range in diameter from about 10 microns or less to about 200 microns, or more, preferably about 50 microns to about 100 microns, along a dimension W as shown in FIG. 4A. Each droplet of the printing material of the present invention can range in volume from about 10 pico liters to about 100 pico liters. The droplets of printing material can be distributed in any suitable number over a given area. Typically, in ink jet printing, the printing material for the droplets form a matrix in which the number of drops per inch (DPI) is specified in the direction of movement of the print head or article to be printed, and in a direction on the surface of the article perpendicular thereto. The application of printing material droplets provided on the surface of the razor blade to form a film can range from about 40 droplets, or less, up to about 10,000 or more, droplets per inch (DPI) in at least one direction. Preferably, the drops per inch, or DPI, of the present invention range from about 50 DPI to about 5000 DPI. Generally, when print heads are arranged vertically, droplets are piezo-ejected from a print head and gravity is the main force. Other print head arrangements, such as those with horizontal jetting or those ranging somewhere between horizontal and vertical jetting are contemplated in the present invention.

The apparatus can comprise a printing apparatus with any suitable number, arrangement, and type of print heads. For example, the apparatus may comprise between 1-20, or more, print heads. The print heads may be arranged in a spaced apart relationship. Alternatively, one or more of the print heads may be positioned adjacent and in contact with another one of the print heads.

If there is more than one print head, the different print heads can be arranged to perform substantially identically or be arranged to perform differently. For instance, print heads may print at different frequencies or their heads may be vertically aligned over a substrate, or rotated at different angles as will be discussed below. These arrangements generally assist in the consistency and accuracy of the printing material coverage by providing precise droplet management and controlled droplet volume.

Referring to FIG. 5, there is shown a stack 50 of blades 20 as they exit a sputter chamber 52. Printing station 72 containing one or more print heads 72a which print ink in the form of droplets 47 on razor blades 20, as shown in FIG. 4 or 4A. The stack of razor blades is supported by a carrier 54 which sits on a roller 74 until taken up by an end or wind up roll 76. In order to print the desired object of certain dimensions on the razor blade, more print heads or as many printing stations as may be needed to provide the appropriate structural build up are added.

Figure 6:
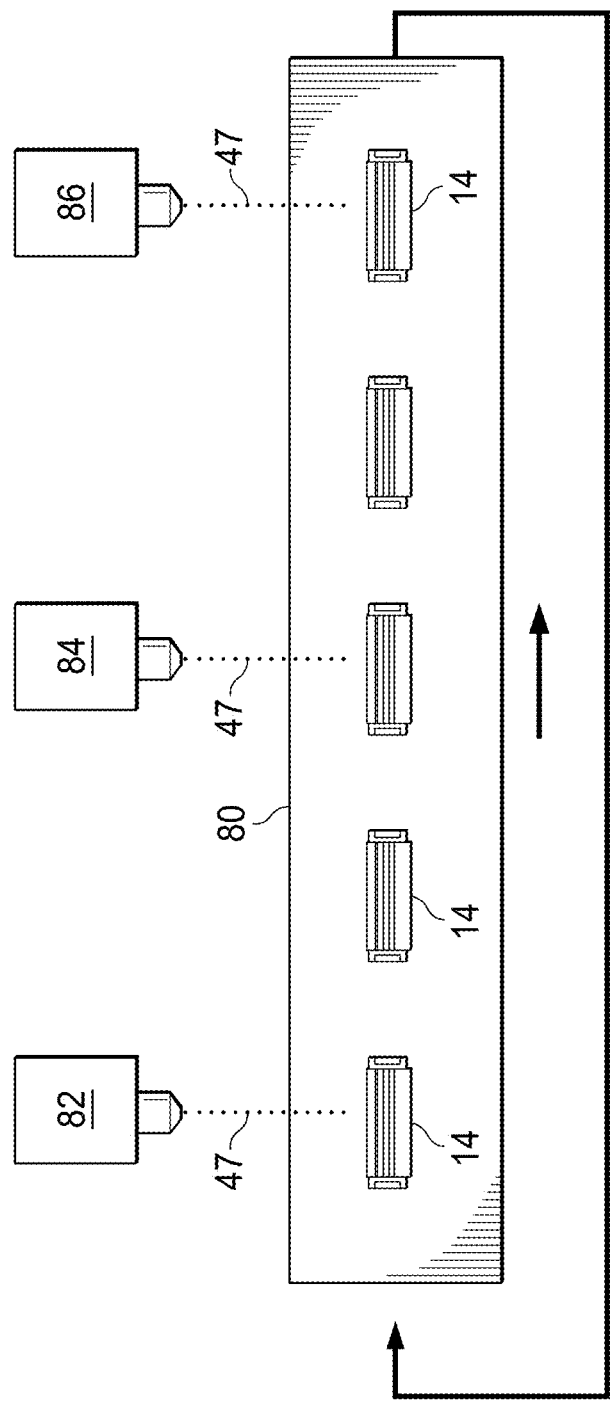
FIG. 6 is a side view of a printing process of the present invention.

Referring to FIG. 6, there is shown a web 80 carrying independent cartridges 14 such as shown in FIG. 1. Cartridges 14 pass under print stations 82, 84 and 86 which print the printing material in the form of droplets 37 on one or more razor blades 20 such as shown in FIG. 4. Cartridges 14 are then passed to the next processing station by web 80.

Figure 7A:
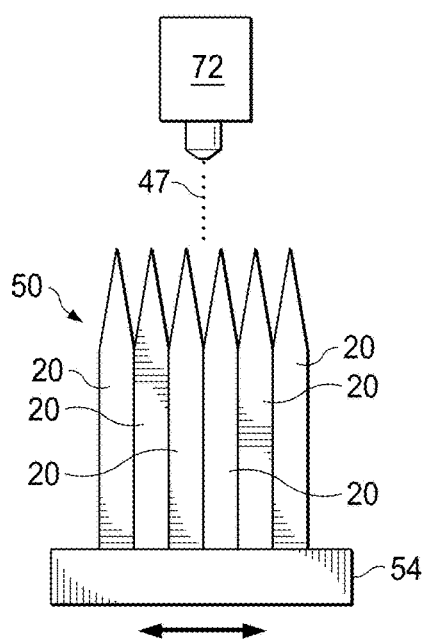
FIGS. 7A and 7B are side views of a printing process of the present invention.
Figure 7B:
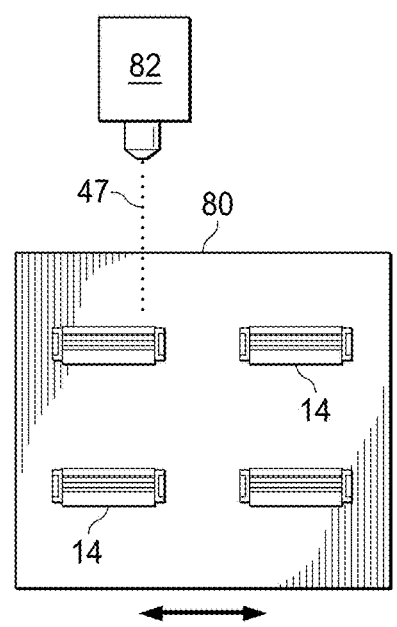

Alternatively, as shown in FIG. 7A and FIG. 7B, in order to print the desired object of certain dimensions on the razor blade, a single print head 72 or 82 may traverse over a stack of razor blades 50 (as shown in FIG. 7A) or a bed of razor cartridges 14 (as shown in FIG. 7B), back and forth, or multiple times, and as many times as necessary to print the desired printed object.

Figure 8:
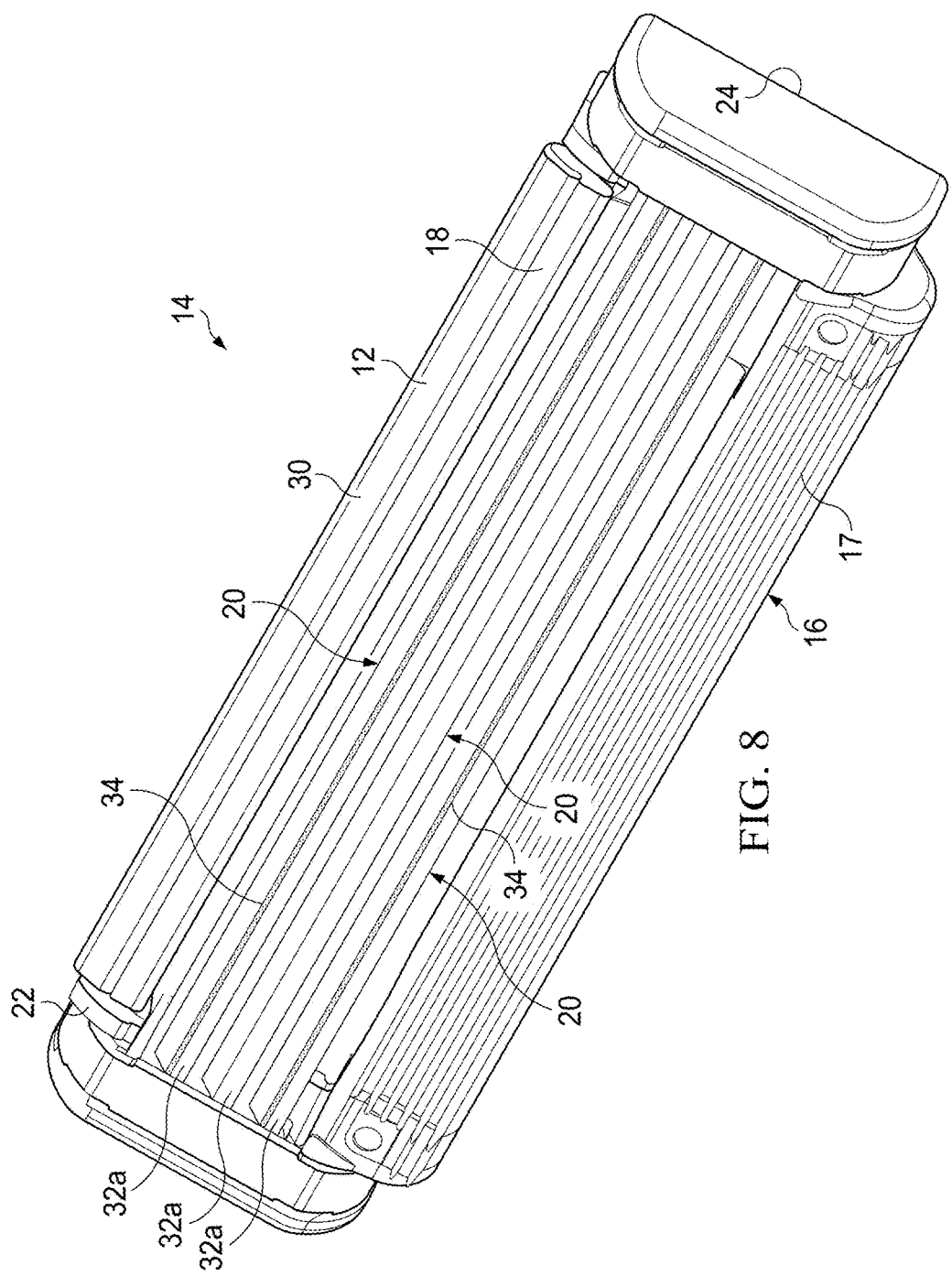
FIG. 8 is a perspective view of another razor cartridge of the present invention.

Referring to FIG. 8, the razor cartridge 14 includes a guard 16 positioned at a front portion of the cartridge 14, a cap 18 positioned at a back portion of cartridge 14, and blades 20 positioned between guard 16 and cap 18. Cartridge 14 includes a top surface 22 and an opposing bottom surface 24. Lubricating members 30 are positioned on the top surface 22 of the cartridge 14. Razor blades 20 each have a visible surface 32a across the top surface 22. The guard 16 includes flexible protrusions 17 in the form of flexible fins extending generally parallel to the one or more elongated blades 20.

The blades 20 along with the lubricating members 30, guard 16, and cap 18 form skin engaging portions of the cartridge 14. The razor blades 20 are located on the cartridge such that they contact or engage the skin during the hair removal process. As shown, in FIG. 8 the printed object 34 is desirably in the form of a layer extending along the length of the surface 32a and/or surface 32b of razor blade 20. The layer of the printed object 34 is preferably continuous. The present invention contemplates less than all the blades in a razor cartridge having printed objects 34 disposed thereon. As shown in one example embodiment in FIG. 8, the blade nearest the cap 18 and the blade nearest the guard 16 have a printed object 34 disposed thereon while the center blade does not. Additionally, the present invention contemplates that each razor blade in a cartridge may or may not have the identical printed object or the identical printing material printed thereon.

Figure 9:
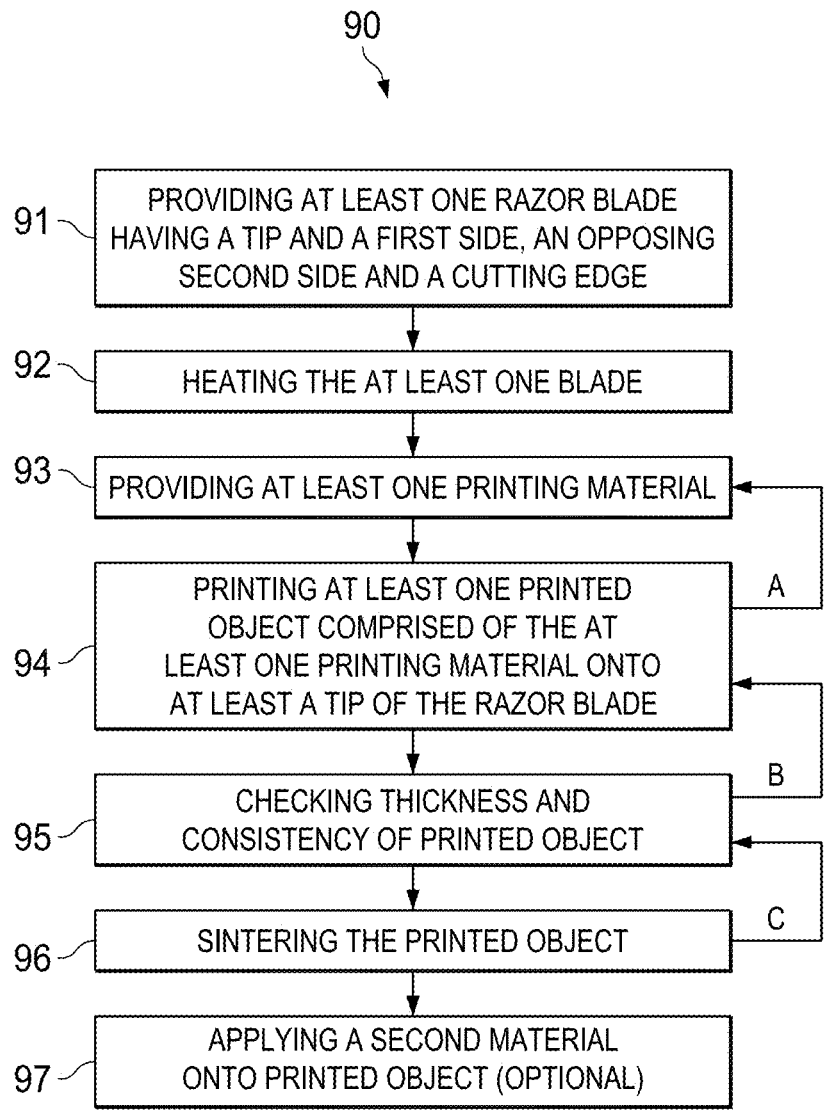
FIG. 9 is a flow diagram of the method of the present invention.

The present invention contemplates a method as shown in the flow diagram 90 of FIG. 9. At Step 91, at least one razor blade is provided having a tip and a first side, an opposing second side and a cutting edge. Typically, a spindle of razor blades as discussed above in FIG. 5-7B, will be provided. At step 92, at least one printing material is provided. A preferred printing material of the present invention includes at least a fluorinated material or telomer composition such as polytetrafluoroethylene (PTFE). Generally, this telomer-based material is desired for its lubricious properties, which in turn improves the glide of the razor blade over the skin.

The printing material of the present invention comprises telomer from about 0.25% solids to about 50% solids by weight of composition. The printing material of the present invention has a viscosity in the range of about 2 centipoise to about 25 centipoise. The printing material of the present invention preferably further comprises a viscosity modifier material, such as glycerol. More preferably, the printing material also comprises an antifoam material.

The amount of telomer in the printing material of the present invention in an aqueous solution may range from about 30% to about 80%. For instance, in one embodiment of the present invention, the printing material may be comprised of about 30% telomer and about 70% propylene glycol. In another embodiment, the printing material may be comprised of about 83% telomer and about 17% BC/Selvesso 100 solvent. A preferable printing material is a fluid comprising about 45% telomer and about 55% glycerol. Even more preferable is the addition in any of the printing materials of an anti-foaming material, since the material properties of telomer solution produce some foaming (e.g., surfactant properties).

The disadvantage of the foaminess of the telomer material is that the trapped air in the foam begins to block the nozzles, which in turn decreases the efficiency or output of those blocked nozzles and thus affects the quality of the printed material. Preferably, an anti-foaming material is added to the printing material. The anti-foaming material of the present invention comprises a chemical additive that reduces and hinders the formation of foam in the printing material. The terms anti-foam agent and defoamer are often used interchangeably.

The present invention contemplates the use of any feasible anti-foam material, such as insoluble oils, polydimethylsiloxanes and other silicones, certain alcohols, stearates and glycols. The material is utilized as an additive to prevent formation of foam or is added to break foam already formed. The anti-foaming material serves to change surface tension in order rupture and break down the air bubbles or trapped air. Preferably in the present invention, the antifoam material is less than about 10% by weight of composition of the printing material; this amount being advantageous in reducing the foaming in the printing material such that the present invention printing material and printing process is optimized. Some preferred antifoam materials include but are not limited to, silicates and silicon based compositions. Silicon based compositions are polymers with silicon and might be delivered as oil or as water based emulsion. The silicone compound consists of hydrophobic silica dispersed in silicone oil. Emulsifiers may be added to ensure that the silicone spreads fast and well in the foaming medium. The silicone compound might also contain silicone glycols and other modified silicone fluids.

Telomer is also known to have a low viscosity. Too low of a viscosity may undesirably cause jetting satellites which may produce a non-homogeneous film. To help mitigate the jetting satellites, a preferred viscosity of the printing material prior to printing is about 2 centipoise to about 25 centipoise.

At step 94 an ink-jet printer having at least one printhead then prints the printing material (e.g., above-referenced telomer composition) forming a printed object on at least the tip of the razor blades. Generally, the printed object comprised of printing material will cover portions of the cutting edge adjacent the tip and may also cover one or both sides of the razor blade.

Preferably a thin object is desired. The desired resultant thickness of the printed object ranges less than or equal to about 1.0 micrometers as measured in a direction perpendicular to one of the sides of the razor blade. See for instance, thickness H in FIG. 4A. Preferably, a substantially uniform thickness is desired. However, it is understood that portions of the printing material, in forming the printed object, will generally flow down one or both of the sides of the razor blades.

At step 95, the thickness and consistency of the printed object is checked and if adequate, the razor blades proceed to a sintering step 96.

The sintering step 96 assists in providing even further adherence and conformity of the printed object onto the surface of the razor blade.

If adequate consistency or thickness is not found after the sintering step 96, then step 94 can be repeated one time or as many more times as needed to achieve the desired coating as shown by arrow C in FIG. 9. Also, step 92 (providing at least one printing material) and step 94 (printing the at least one printing material) may also be repeated prior to sintering step 96 as shown in FIG. 9 by arrows A and B. A single or multiple pass system for any of the steps is contemplated in the present invention.

The razor blades themselves may be pre-heated at step 93 prior to printing step 94. The heating of the blades is desired to assist in the adherence of the printing material onto the blade and to assist in the melt and flow for an optimal printed object. Generally, the temperature that the blades are heated up to is above the evaporation temperature of water.

After the sintering step 96, other optional steps 97 of applying materials may also be accomplished. Materials applied or other steps may occur which do not involve the use of the print heads. For instance, a spraying step 97 of a material (e.g., a second material) may optionally be performed to provide an additional outer coating of either the same printing material or a different material altogether. Desirably, the newly applied sprayed material may also be comprised of a polymer, such as telomer. This step may produce an outer layer of telomer which may assist in enhancing the coverage of any previously printed printing material (e.g., telomer composition) on the razor blade. Additionally, other steps of applying materials 97 may include applying a solvent serving to further remove or thin any printing material that was printed on the razor blade using the steps of FIG. 9.

Additionally, it should be noted that the present invention contemplates that one or more printing materials may be provided for printing onto the razor blade at step 92. The printed object may comprise multiple layers of printing materials. A layer may be printed after one or multiple passes or repetitions of printing step 94. A first layer thus may comprise a printed object of a first printing material. A second layer may comprise a printed object of a second printing material and so on. The present invention provides for a first printing material that may be different or the same as a second printing material and/or a third printing material printed on the printed object onto the razor blade tip and/or one or more sides. For instance, a first printing material may be printed as a first layer and be less polymeric than a second printing material printed as a second layer, the second layer intended to be on an outer surface of the razor blade and hence desirably more polymeric or lubricious.

Figure 10:
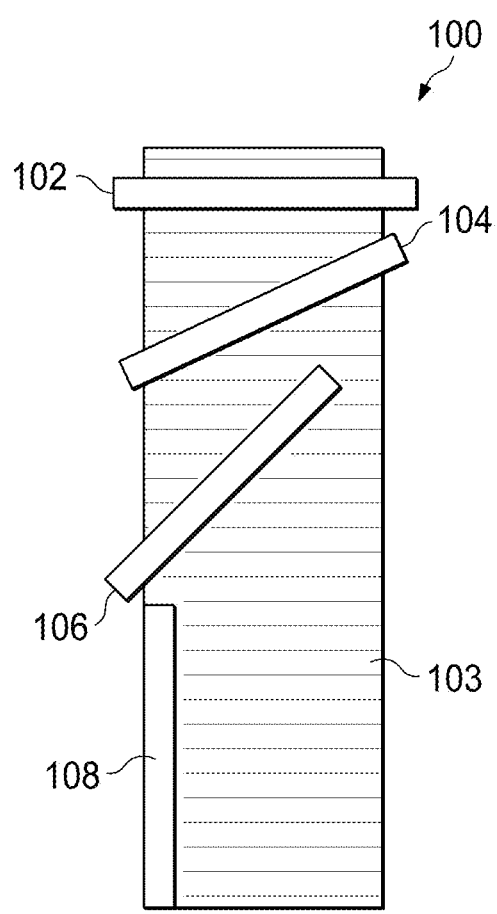
FIG. 10 is a diagram of a print head of the present invention.

Preferably, one or more of the print heads or nozzles of a print station can be rotated or angled as shown in the exemplary orientations 100 in FIG. 10. Any other feasible print head orientations are also contemplated in the present invention. The rotation and/or angle of the printheads may be of any desired arrangement to provide adequate fluid deposition along the razor blade (e.g., edge). One type of print head that may be used in the present invention is an S-Class Industrial Print Head which may include 128 nozzles over 2.50 inches, each nozzle capable of about 80 picoliter drop size. FIG. 10 depicts a top view of four Industrial Print Heads 102, 104, 106, and 108 over a razor blade spindle 103. Accordingly, the printing by print heads 102, 104, 106, and 108 is directed into the page. Each print head 102, 104, 106, and 108 may be rotated or angled over the razor blade spindle 103 at different angles as shown. Print head 102 is shown as being disposed perpendicularly to the razor blade spindle 103. The print heads of the present invention may be angled from zero to about 90 degrees as shown in the various orientations of FIG. 10 by increasing the angles relative to the un-sabered or un-angled print head 102. The angle of print head 104 is about 25 degrees relative to print head 102, while the angle of print head 106 is about 45 degrees relative to print head 102 and further the angle of print head 108 is about 90 degrees relative to the un-sabered print head 102.

The print head, when "sabered" or angled, will have the effect of changing the dots per inch (dpi) of printed material that are laid down across the blade in one or more dimensions, for instance the width dimension. By doing so, coverage, or the dots per inch, of printed material increases across the desired substrate (e.g., a blade edge).

It should be noted that print heads 102, 104, 106, and 108 do not necessarily have to be the same type of print head. They each may have different capabilities and thus, any arrangement for optimal coverage of the printing material on the razor blade is contemplated in the present invention.

Figure 11:
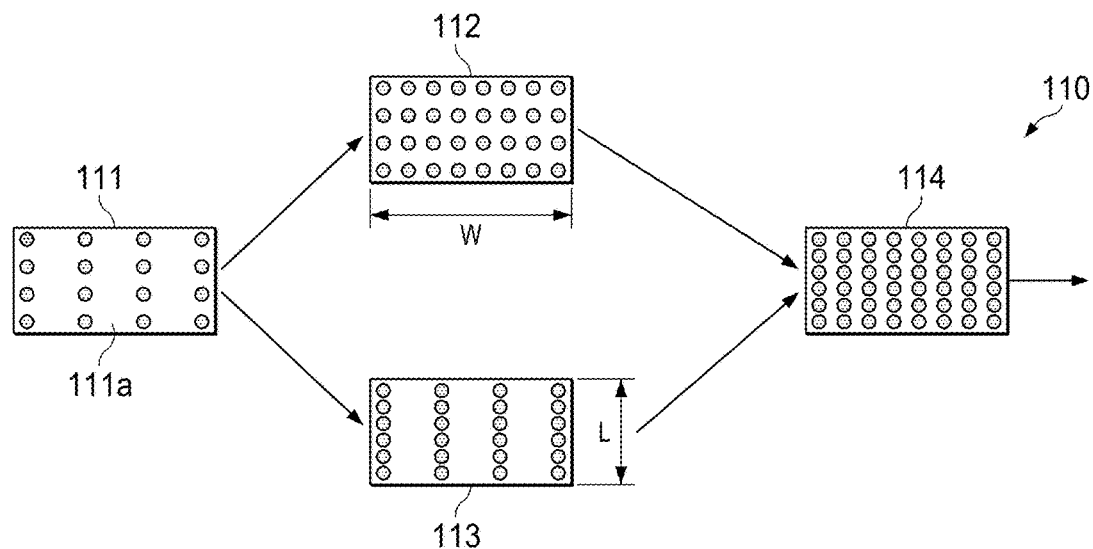
FIG. 11 is a diagram of alternate preferred embodiments of the present invention.

FIG. 11 depicts a block diagram showing the increase in the outputs on a substrate 111a from that of a native or original print head 111 to that of an angled or sabered print head 112 (e.g., such as those described in FIG. 10). As shown, the sabered print head 112 output on the substrate 111a is approximately double that of the original print head 111 across the width W of the substrate 111a.

Each printhead of the multiple printheads may also each eject the printing material, desirably a fluid, at different rates (e.g., firing frequency). Varying the firing frequency changes the dots per inch of material that is laid down by the print head along the length. Accordingly, increasing the firing frequency increases the dots per inch laid down. Advantageously, the dots per inch (dpi) laydown of the present invention is equal to or greater than 50 dpi. As shown, the output of print head 113 on the substrate 111a is approximately double that of the original print head 111 along the length L of the substrate 111a.

In general, the types of print heads utilized, the rotating and/or changing the angle of the print heads, and the managing of the firing frequency of the printing material though the print heads for improved printing material deposition is encompassed in the present invention. It follows that any of a number of combinations and permutation of providing an angled or rotated print head and managing or increasing the firing frequency of the print head results in desirable coverage of fluid deposition of the printed material on the substrate or blade edge.

An example of this type of beneficial coverage is depicted in FIG. 11 at the output of print head 114 on substrate 111a where the improvements in fluid deposition across the length and width and coverage compared to that of the output of print heads 111, 112, or 113, is evidently increased.

Thus, a benefit of the printing material and the printing process of the present invention described above is that the print heads are precisely and desirably aligned over the substrate (e.g., razor blades) and thus are capable of precisely locating the printing material (e.g., telomer composition) to cover the desired area on the substrate (e.g., the razor blade edge).

Figure 12:
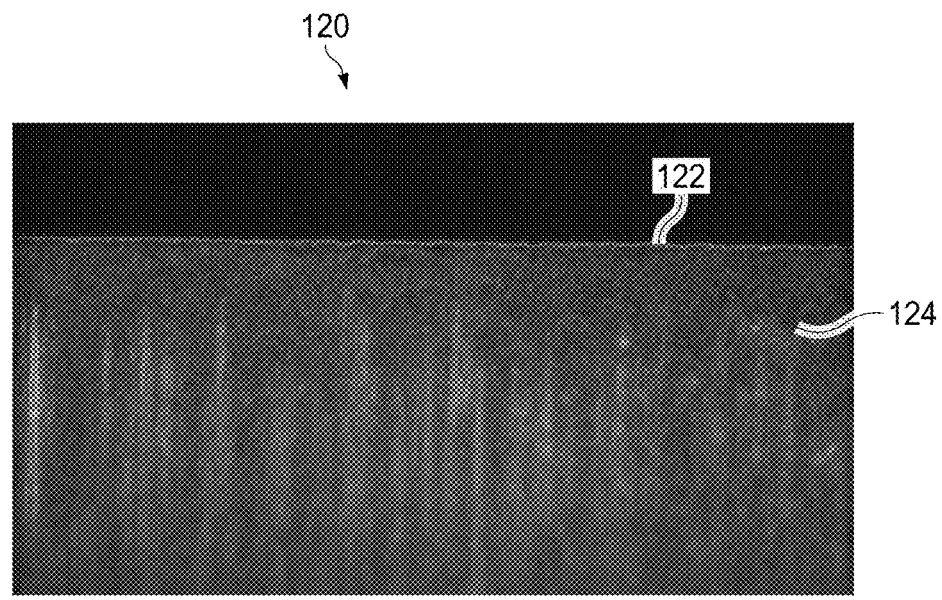
FIG. 12 is a micrograph of a razor blade edge with the printed material of the present invention deposited thereon.

Turning to FIG. 12, a micrograph 120 of a razor blade edge 122 with the printing material 124 of the present invention deposited thereon utilizing the novel printing process of FIG. 9 is shown. The printed material 124 on the edge 122 comprises about 45% telomer solution by weight of composition and 55% glycerol solution by weight of composition with less than 1% by weight of composition of antifoam material. The percentage by weight of composition of telomer solids in this example printed material is about 9%. The printing material utilized in FIG. 12 has an 80 pico liters droplet size, 89.44 DPI and print head(s) is sabered at an angle of 56 degrees with a single pass of the process of FIG. 9. An adequate printing material (e.g., 80 picoliter droplet size, 50 DPI) may also be printed (not shown) with similar results without sabering of the print head(s) (e.g., zero degree angle), but with multiple passes of the printing process of FIG. 9.

EXAMPLES/COMBINATIONS

A. A method of making a razor blade for a razor cartridge, comprising the steps of:
  a. providing at least one razor blade, the razor blade having a tip, a first side, an opposing second side, and a cutting edge extending along a length of the razor blade;
  b. providing at least one printing material; and c. printing the at least one printing material onto at least the tip of the at least one razor blade to form at least one printed object comprised of the at least one printing material.

B. The method of paragraph A, wherein the printing step comprises inkjet printing.

C. The method of paragraphs A or B, wherein the inkjet printing comprises at least one printhead.

D. The method of paragraphs A-C, wherein the inkjet printing comprises first and second printheads of different types.

E. The method of paragraphs A-D, wherein at least one of the at least one printhead is angled at an angle from about zero (0) degrees to about ninety (90) degrees.

F. The method of any of the preceding paragraphs, wherein the at least one printed object has a droplet size ranging from about 40 droplets per inch to about 10,000 droplets per inch.

G. The method of any of the preceding paragraphs, wherein a diameter of a droplet of printing material ranges from about 10 microns or less to about 200 microns, or more.

H. The method of any of the preceding paragraphs, wherein a volume of a droplet of printing material ranges from about 10 pico liters to about 100 pico liters.

I. The method of any of the preceding paragraphs, wherein the at least one printing material is lubricious.

J. The method of any of the preceding paragraphs, wherein the at least one printing material comprises a polymer.

K. The method of any of the preceding paragraphs, wherein the at least one printing material comprises a telomer from about 0.25% solids to about 50% solids by weight of composition.

L. The method of any of the preceding paragraphs, wherein the at least one printing material comprises a viscosity modifying material.

M. The method of any of the preceding paragraphs, wherein a viscosity of the printing material is from about 2 centipoise to about 25 centipoise.

N. The method of any of the preceding paragraphs, wherein the at least one printing material comprises an anti-foaming material.

O. The method of any of the preceding paragraphs, wherein the at least one printing material comprises less than about 10% by weight of composition of the anti-foaming material.

P. The method of any of the preceding paragraphs, wherein step (b) further comprises providing a plurality of printing materials, each one of the plurality of printing materials comprised of the same composition or different compositions.

Q. The method of any of the preceding paragraphs, further comprising the step (d) sintering the at least one printed object.

R. The method of any of the preceding paragraphs, wherein the printed object melts and flows down the first side, the second side of the cutting edge of the at least one razor blade, or any combination thereof.

S. The method of any of the preceding paragraphs, wherein printing step (c) is repeated one or more times.

T. The method of any of the preceding paragraphs, further comprising step (e) of applying a second material on the at least one printed object.

U. The method of any of the preceding paragraphs, wherein the second material is different than the at least one printing material.

V. The method of any of the preceding paragraphs, further comprising a plurality of razor blades on a spindle.

W. The method of any of the preceding paragraphs, wherein the at least one razor blade is heated prior to printing step (c).

X. The method of any of the preceding paragraphs, wherein the at least one printed object has a thickness of about one micrometer as measured in a direction perpendicular to one of the sides of the razor blade.

Y. The method of any of the preceding paragraphs, wherein the at least one printed object comprises a plurality of solid objects of one or more printed dots.

Z. The method of any of the preceding paragraphs, wherein printing step (c) is repeated until a layer of a plurality of printed dots is formed.

AA. The method of any of the preceding paragraphs, wherein the at least one printed object is adjacent to the cutting edge.

BB. The method of any of the preceding paragraphs, wherein the at least one printed object extends along the length of the razor blade.

CC. A razor blade for a razor cartridge, comprising:
  a. a first side, an opposing second side, and a cutting edge extending along a length of the razor blade; and
  b. at least one printed object comprised of at least one printing material ink-jet printed on the cutting edge of the razor blade.

DD. The razor blade of paragraph CC, wherein the printed object extends along the length of the razor blade.

EE. The razor blade of paragraphs CC or DD, wherein the at least one printing material is comprised of about 0.25% solid to about 50% solids by weight of composition of telomer.

FF. A razor cartridge comprising a plurality of blades each with a cutting edge, with at least one blade of the plurality of blades having at least one printed object printed thereon, the at least one printed object comprised of at least one printing material wherein the at least one printing material is comprised of about 0.25% solid to about 50% solids by weight of composition of telomer.

GG. The razor cartridge of paragraph FF, wherein one of the plurality of razor blades has a different printing material than another razor blade in the cartridge.

HH. The printing material of paragraphs FF or GG further comprising about 55% glycerol solution by weight of composition.

II. The printing material of paragraphs FF, GG, or HH further comprising an anti-foaming material.

JJ. The printing material of any of the preceding paragraphs, wherein a diameter of a droplet of printing material ranges from about 10 microns or less to about 200 microns, or more.

KK. The printing material of any of the preceding paragraphs, wherein a volume of a droplet of printing material ranges from about 10 pico liters to about 100 pico liters.

It should be understood that every maximum numerical limitation given throughout this specification includes every lower numerical limitation, as if such lower numerical limitations were expressly written herein. Every minimum numerical limitation given throughout this specification includes every higher numerical limitation, as if such higher numerical limitations were expressly written herein. Every numerical range given throughout this specification includes every narrower numerical range that falls within such broader numerical range, as if such narrower numerical ranges were all expressly written herein.

All parts, ratios, and percentages herein, in the Specification, Examples, and Claims, are by weight and all numerical limits are used with the normal degree of accuracy afforded by the art, unless otherwise specified.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

All documents cited in the DETAILED DESCRIPTION OF THE INVENTION are, in the relevant part, incorporated herein by reference; the citation of any document is not to be construed as an admission that it is prior art with respect to the present invention. To the extent that any meaning or definition of a term or in this written document conflicts with any meaning or definition in a document incorporated by reference, the meaning or definition assigned to the term in this written document shall govern. Except as otherwise noted, the articles "a," "an," and "the" mean "one or more."

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of making a razor blade for a razor cartridge, comprising the steps of:
   a. providing at least one razor blade, the razor blade having a tip, a first side, an opposing second side, and a cutting edge extending along a length of said razor blade;
   b. providing at least one printing material; and
   c. printing said at least one printing material onto at least the tip of said at least one razor blade to form at least one printed object comprised of said at least one printing material wherein said at least one printed object comprises a plurality of solid objects of one or more printed dots, wherein said printing step comprises inkjet printing.

2. The method of claim 1, wherein the inkjet printing comprises at least one printhead.

3. The method of claim 2, wherein the inkjet printing comprises first and second printheads of different types.

4. The method of claim 3, wherein at least one of the at least one printhead is angled at an angle from about zero (0) degrees to about ninety (90) degrees.

5. The method of claim 1, wherein said at least one printed object has a droplet size ranging from about 40 droplets per inch to about 10,000 droplets per inch.

6. The method of claim 1, wherein a diameter of a droplet of printing material ranges from about 10 microns to about 200 microns.

7. The method of claim 1, wherein a volume of a droplet of printing material ranges from about 10 pico liters to about 100 pico liters.

8. The method of claim 1, wherein said at least one printing material is lubricious.

9. The method of claim 1, wherein said at least one printing material comprises a polymer.

10. The method of claim 1, wherein said at least one printing material comprises a telomer from about 0.25% solids to about 50% solids by weight of printing material.

11. The method of claim 1, wherein said at least one printing material comprises a viscosity modifying material.

12. The method of claim 11, wherein said at least one printing material comprises less than about 10% by weight of composition of said anti-foaming material.

13. The method of claim 12, wherein said printed object melts and flows down the first side, the second side of the cutting edge of the at least one razor blade, or any combination thereof.

14. The method of claim 1, wherein a viscosity of said printing material is from about 2 centipoise to about 25 centipoise.

15. The method of claim 1, wherein said at least one printing material comprises an anti-foaming material.

16. The method of claim 1, wherein step (b) further comprises providing a plurality of printing materials, each one of said plurality of printing materials comprised of the same composition or different compositions.

17. The method of claim 1, further comprising a step (d) of sintering said at least one printed object.

18. The method of claim 1, wherein printing step (c) is repeated one or more times.

19. The method of claim 1, further comprising applying step (e) of applying a second material on said at least one printed object.

20. The method of claim 19, wherein said second material is different than said at least one printing material.

21. The method of claim 1, further comprising a plurality of razor blades on a spindle.

22. The method of claim 1, wherein said at least one razor blade is heated prior to printing step (c).

23. The method of claim 1, wherein the at least one printed object has a thickness of about one micrometer as measured in a direction perpendicular to one of said sides of the razor blade.

24. The method of claim 1, wherein printing step (c) is repeated until a layer of a plurality of printed dots is formed.

25. The method of claim 1, wherein said at least one printed object is adjacent to the cutting edge.

26. The method of claim 1, wherein said at least one printed object extends along the length of said razor blade.

* * * * *